United States Patent
Kwon

(10) Patent No.: US 10,665,733 B2
(45) Date of Patent: May 26, 2020

(54) COMPOSITION FOR FORMING SOLAR CELL ELECTRODE AND ELECTRODE PREPARED USING THE SAME

(71) Applicant: SAMSUNG SDI CO., LTD., Yongin-si, Gyeonggi-do (KR)

(72) Inventor: Dae Chan Kwon, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 8 days.

(21) Appl. No.: 15/857,965

(22) Filed: Dec. 29, 2017

(65) Prior Publication Data

US 2018/0226525 A1 Aug. 9, 2018

(30) Foreign Application Priority Data

Feb. 9, 2017 (KR) .................. 10-2017-0017907

(51) Int. Cl.
| | | |
|---|---|---|
| H01L 31/0224 | (2006.01) | |
| C07F 7/08 | (2006.01) | |
| C08G 77/04 | (2006.01) | |
| C08K 3/40 | (2006.01) | |
| C08L 83/04 | (2006.01) | |
| H01B 1/24 | (2006.01) | |
| H01B 1/22 | (2006.01) | |

(Continued)

(52) U.S. Cl.
CPC .... *H01L 31/022466* (2013.01); *C07F 7/0807* (2013.01); *C08G 77/04* (2013.01); *C08K 3/40* (2013.01); *C08L 83/04* (2013.01); *H01B 1/22* (2013.01); *H01B 1/24* (2013.01); *H01L 31/022425* (2013.01); *C08G 77/045* (2013.01); *C08K 2003/0806* (2013.01); *C08K 2003/0812* (2013.01); *C08K 2003/0831* (2013.01); *C08K 2003/0862* (2013.01); *C08K 2201/001* (2013.01); *H01L 51/0094* (2013.01); *H01L 2031/0344* (2013.01)

(58) Field of Classification Search
None
See application file for complete search history.

(56) References Cited

U.S. PATENT DOCUMENTS

| | | | | |
|---|---|---|---|---|
| 8,299,198 B2 * | 10/2012 | Manabe | ................. | C08G 77/04 528/31 |
| 2011/0062619 A1 * | 3/2011 | Laine | .................... | B82Y 10/00 264/134 |

(Continued)

FOREIGN PATENT DOCUMENTS

| | | |
|---|---|---|
| CN | 102732150 A | 10/2012 |
| CN | 104575677 A | 4/2015 |

(Continued)

OTHER PUBLICATIONS

Office Action dated Dec. 21, 2018 in the corresponding Korean Patent Application No. 10-2017-0017907.

(Continued)

*Primary Examiner* — Katie L. Hammer
(74) *Attorney, Agent, or Firm* — Lee IP Law, PC

(57) ABSTRACT

A composition for solar cell electrodes, an electrode formed of the same, and a method of forming an electrode, the composition including a conductive powder; a glass frit; at least one of a cyclosiloxane compound and a silsesquioxane compound; and an organic vehicle.

7 Claims, 1 Drawing Sheet

(51) Int. Cl.
*H01L 51/00* (2006.01)
*H01L 31/0256* (2006.01)
*C08K 3/08* (2006.01)

(56) References Cited

U.S. PATENT DOCUMENTS

| | | | | |
|---|---|---|---|---|
| 2012/0152343 | A1* | 6/2012 | Cheng | H01B 1/22 |
| | | | | 136/256 |
| 2013/0165611 | A1* | 6/2013 | Manabe | C07F 7/21 |
| | | | | 526/279 |
| 2015/0368514 | A1* | 12/2015 | Kamuro | C08L 83/04 |
| | | | | 524/588 |
| 2016/0163890 | A1* | 6/2016 | Yeh | C03C 3/122 |
| | | | | 136/256 |

FOREIGN PATENT DOCUMENTS

| | | |
|---|---|---|
| CN | 105741905 A | 7/2016 |
| JP | 2015-144162 A | 8/2015 |
| JP | 2016-127276 A | 7/2016 |
| KR | 10-2016-0012093 A | 2/2016 |
| KR | 10-2016-0061370 A | 5/2016 |
| TW | 201230068 A | 7/2012 |

OTHER PUBLICATIONS

Office Action dated Apr. 25, 2019 in the corresponding Chinese Patent Application No. 201810051191.2.

\* cited by examiner

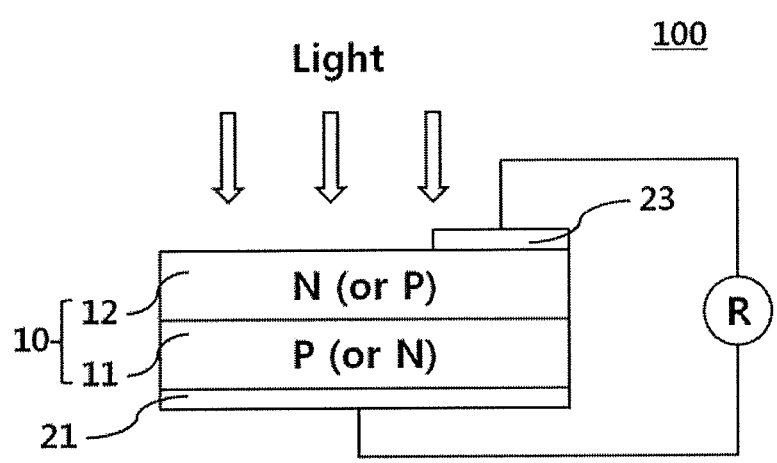

COMPOSITION FOR FORMING SOLAR CELL ELECTRODE AND ELECTRODE PREPARED USING THE SAME

CROSS-REFERENCE TO RELATED APPLICATION

Korean Patent Application No. 10-2017-0017907, filed on Feb. 9, 2017, in the Korean Intellectual Property Office, and entitled: "Composition for Forming Solar Cell Electrode and Electrode Prepared Using the Same," is incorporated by reference herein in its entirety.

BACKGROUND

1. Field

Embodiments relate to a composition for solar cell electrodes and an electrode formed of the same.

2. Description of the Related Art

A silicon-based solar cell may include a substrate formed of a p-type silicon semiconductor and an emitter layer formed of an n-type silicon semiconductor. A p-n junction is formed between the p-type substrate and the n-type emitter layer. When light, e.g., sunlight, enters the solar cell having such a structure, electrons are generated as majority carriers in the emitter layer formed of the n-type silicon semiconductor and holes are generated as majority carriers in the substrate formed of the p-type silicon semiconductor due to the photovoltaic effect. The electrons and holes generated due to the photovoltaic effect move to a front electrode and a rear electrode bonded to upper and lower surfaces of the emitter layer, respectively, and current flows when these electrodes are connected to each other by a wire.

SUMMARY

Embodiments are directed to a composition for solar cell electrodes and an electrode formed of the same.

The embodiments may be realized by providing a composition for solar cell electrodes, the composition including a conductive powder; a glass frit; at least one of a cyclosiloxane compound and a silsesquioxane compound; and an organic vehicle.

The at least one of the cyclosiloxane compound and silsesquioxane compound may be present in an amount of about 0.1 wt % to about 2 wt % in the composition for solar cell electrodes.

The composition may have an area change rate of about 60% or less, as calculated according to the following Equation 1:

$$\text{Area change rate} = (|S_1 - S_0|/S_0) \times 100 \quad (1),$$

wherein, in Equation 1, $S_0$ denotes a cross-sectional area in $\mu m^2$ of an electrode formed by printing the composition for solar cell electrodes and not subjected to drying and baking, and $S_1$ denotes a cross-sectional area in $\mu m^2$ of the electrode subjected to drying at 300° C. for 40 seconds and baking at 800° C. for 60 seconds.

The composition may include the cyclosiloxane compound, and the cyclosiloxane compound may include hexamethylcyclotrisiloxane, octamethylcyclotetrasiloxane, decamethylcyclopentasiloxane, dodecamethylcyclohexasiloxane, tetradecamethylcycloheptasiloxane, octadecamethylcyclononasiloxane, tetramethylcyclotetrasiloxane, hexaphenylcyclotrisiloxane, tetramethyl-tetravinylcyclotetrasiloxane, tris(trifluoropropyl)-trimethylcyclotrisiloxane, hexadecamethylcyclooctasiloxane, pentamethylcyclopentasiloxane, hexamethylcyclohexasiloxane, octaphenylcyclotetrasiloxane, triphenylcyclotrisiloxane, tetraphenylcyclotetrasiloxane, tetramethyl-tetraphenylcyclotetrasiloxane, tetravinyl-tetraphenylcyclotetrasiloxane, hexamethyl-hexavinylcyclohexasiloxane, hexamethyl-hexaphenylcyclohexasiloxane, or hexavinyl-hexaphenylcyclohexasiloxane.

The composition may include the silsesquioxane compound, and the silsesquioxane compound may include octaphenylsilsesquioxane, octamethylsilsesquioxane, or octavinylsilsesquioxane.

The glass frit may include a bismuth-tellurium-oxide (Bi—Te—O)-based glass fit.

The bismuth-tellurium-oxide (Bi—Te—O)-based glass frit may further include an elemental metal, the elemental metal including lithium (Li), zinc (Zn), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), or manganese (Mn).

The composition may include about 60 wt % to about 95 wt % of the conductive powder; about 0.1 wt % to 2 wt % of the at least one of the cyclosiloxane compound and silsesquioxane compound; about 0.1 wt % to about 20 wt % of the glass frit; and about 1 wt % to about 30 wt % of the organic vehicle.

The composition for solar cell electrodes may further include a dispersant, a thixotropic agent, a plasticizer, a viscosity stabilizer, an anti-foaming agent, a pigment, a UV stabilizer, an antioxidant, or a coupling agent.

The embodiments may be realized by providing an electrode formed of the composition for solar cell electrodes according to an embodiment.

The embodiments may be realized by providing a method of forming an electrode, the method comprising applying the composition for solar cell electrodes according to an embodiment on a substrate.

BRIEF DESCRIPTION OF DRAWING

Features will be apparent to those of ordinary skill in the art by describing in detail exemplary embodiments with reference to the attached drawing in which:

The FIGURE illustrates a schematic view of a solar cell according to an embodiment.

DETAILED DESCRIPTION

Example embodiments will now be described more fully hereinafter with reference to the accompanying drawing; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. It will also be understood that when a layer or element is referred to as being "on" another layer or element, it can be directly on the other layer or element, or intervening layers may also be present. In addition, it will also be understood that when a layer is referred to as being "between" two layers, it can be the only layer between the two layers, or one or more intervening layers may also be present. Like reference numerals refer to like elements throughout. As used herein, the term "or" is not an exclusive term, e.g., "A or B" would include A, B, or A and B.

Composition for Solar Cell Electrodes

A composition for solar cell electrodes according to an embodiment may include, e.g., a conductive powder; a glass frit; at least one of a cyclosiloxane compound and a silsesquioxane compound (e.g., a cage silsesquioxane compound); and an organic vehicle. For example, the composition may include a cyclosiloxane compound or a silsesquioxane compound.

In an implementation, the composition for solar cell electrodes may have an area change rate of about 60% or less, e.g. about 45% or less or about 40% or less, as calculated according to Equation 1. Within this range of area change rate, the composition may help reduce post-baking shrinkage of an electrode while having excellent processability and reliability when used to fabricate the electrode.

$$\text{Area change rate} = (|S_1 - S_0|/S_0) \times 100 \qquad \text{<Equation 1>}$$

In Equation 1, wherein $S_0$ denotes a cross-sectional area (unit: $\mu m^2$) of an electrode formed by printing the composition for solar cell electrodes and not subjected to drying and baking, and $S_1$ denotes a cross-sectional area (unit: $\mu m^2$) of the electrode subjected to drying at 300° C. for 40 seconds and baking at 800° C. for 60 seconds.

For example, in measurement of the area change rate according to Equation 1, the composition for solar cell electrodes may be printed with a maximum line width of about 30 μm to about 70 μm, a maximum height of about 10 μm to about 20 μm, and an aspect ratio of about 0.15 to about 0.30, followed by measurement of $S_0$ and $S_1$. Herein, "aspect ratio" refers to a ratio of maximum height to maximum width (maximum height/maximum width). For example, the area change rate according to Equation 1 may be measured on an electrode obtained by printing the composition for solar cell electrodes such that the electrode has a rectangle shape, square shape, triangle shape, trapezoid shape, or a rectangle or square shape with one semicircular side in cross-section. For example, the area change rate according to Equation 1 may be measured on an electrode obtained by depositing the composition for solar cell electrodes on a monocrystalline silicon wafer by screen printing.

In an implementation, the composition for solar cell electrodes may provide excellent electrical properties such as contact resistance, serial resistance, and open circuit voltage after baking, and may include the cyclosiloxane compound or silsesquioxane compound.

Now, each component of the composition for solar cell electrodes according to an embodiment will be described in more detail.

Conductive Powder

The conductive powder may include a metal powder of, e.g., silver, gold, platinum, palladium, aluminum, or nickel. In an implementation, the conductive powder may include silver (Ag) powder.

In an implementation, the conductive powder may have a nanometer or micrometer-scale particle size. For example, the conductive powder may have a particle size of dozens to several hundred nanometers, or a particle diameter of several to dozens of micrometers. In an implementation, the conductive powder may be a mixture of two or more types of conductive powders having different particle sizes.

The conductive powder may have various particle shapes, e.g., a spherical shape, a flake shape, and an amorphous shape.

The conductive powder may have an average particle diameter (D50) of about 0.1 μm to about 10 μm, e.g., about 0.5 μm to about 5 μm. Within this range, the composition can reduce contact resistance and serial resistance of a solar cell. The average particle diameter may be measured using, e.g., a Model 1064D (CILAS Co., Ltd.) after dispersing the conductive powder in isopropyl alcohol (IPA) at 25° C. for 3 minutes via ultrasonication.

The conductive powder may be present in an amount of, e.g., about 60 wt % to about 95 wt %, based on a total weight of the composition for solar cell electrodes. Within this range, the composition may help improve conversion efficiency of a solar cell and may be easily prepared in paste form. In an implementation, the conductive powder may be present in an amount of, e.g., about 70 wt % to about 90 wt % based on the total weight of the composition for solar cell electrodes.

Glass Frit

The glass frit may serve to form silver crystal grains in an emitter region by etching an anti-reflection layer and melting the conductive powder during a baking process of the composition for solar cell electrodes. Further, the glass frit may help improve adhesion of the conductive powder to a wafer and may be softened to decrease the baking temperature during the baking process.

In an implementation, the glass frit may include a low-melting point glass frit having a glass transition temperature of about 200° C. to about 300° C. Within this range, the glass frit may provide good contact resistance.

In an implementation, the glass frit may be a lead-free glass frit. In an implementation, the glass frit may be a bismuth-tellurium-oxide (Bi—Te—O)-based glass frit including elemental bismuth and tellurium. The glass frit including elemental bismuth and tellurium can provide good contact resistance and increased open circuit voltage. In an implementation, the glass frit may further include elemental metals in addition to bismuth and tellurium. In an implementation, the glass frit may further include, e.g., lithium (Li), zinc (Zn), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), or manganese (Mn). In an implementation, the glass frit is a bismuth-tellurium-zinc-lithium-oxide (Bi—Te—Zn—Li—O)-based glass frit.

In an implementation, the glass frit may have an average particle diameter (D50) of about 0.1 μm to about 10 μm. In an implementation, the glass frit may have a spherical or amorphous shape. The average particle diameter (D50) may be measured using, for example, a Model 1064D (CILAS Co., Ltd.) after dispersing the glass frit in isopropyl alcohol (IPA) at 25° C. for 3 minutes via ultrasonication.

The glass frit may be prepared from tellurium oxide, bismuth oxide, and, optionally, the aforementioned metals and/or metal oxides by a suitable method. For example, tellurium oxide, bismuth oxide, and, optionally, the metals and/or metal oxides are mixed using a ball mill or a planetary mill. The mixture may then be melted at about 800° C. to about 1300° C., followed by quenching to 25° C. The resulting material may be subjected to pulverization using a disk mill, a planetary mill, or the like, thereby preparing the glass frit.

In an implementation, the glass frit may be present in an amount of about 0.1 wt % to about 20 wt %, e.g., about 0.5 wt % to about 10 wt %, based on the total weight of the composition for solar cell electrodes. Within this range, the glass frit may help secure stability of a p-n junction under various sheet resistances, minimize serial resistance, and ultimately improve solar cell efficiency.

Cyclosiloxane Compound and/or the Silsesquioxane Compound

The cyclosiloxane compound and/or the silsesquioxane compound may help reduce the area change rate according to Equation 1 without increasing viscosity of the composition.

The cyclosiloxane compound may be a cyclic siloxane compound having a ring of silicon-oxygen-silicon-oxygen. For example, the cyclosiloxane compound may not be a polymer. In an implementation, the compound may include a substituted or unsubstituted one of, e.g., cyclotrisiloxane, cyclotetrasiloxane, cyclopentasiloxane, cyclohexasiloxane, cycloheptasiloxane, cyclooctasiloxane, cyclononasiloxane, or cyclodecasiloxane. As used herein, the term "substituted" means that at least one hydrogen atom bonded to silicon (Si) of siloxane is substituted with a $C_1$ to $C_5$ alkyl group (for example, a methyl group, an ethyl group, a propyl group, a butyl group, or a pentyl group), a $C_2$ to $C_5$ alkenyl group (for example, a vinyl group), a $C_6$ to $C_{10}$ aryl group (a phenyl group), or a $C_1$ to $C_5$ halogenated alkyl group (for example, a trifluoropropyl group).

In an implementation, the cyclosiloxane compound may include, e.g., hexamethylcyclotrisiloxane, octamethylcyclotetrasiloxane, decamethylcyclopentasiloxane, dodecamethylcyclohexasiloxane, tetradecamethylcycloheptasiloxane, octadecamethylcyclononasiloxane, tetramethylcyclotetrasiloxane, hexaphenylcyclotrisiloxane, tetramethyl-tetravinyl-cyclotetrasiloxane such as 2,4,6,8-tetramethyl-2,4,6,8-tetravinylcyclotetrasiloxane, tris(trifluoropropyl)-trimethylcyclotrisiloxane such as 1,3,5-tris(3,3,3-trifluoropropyl)-1,3,5-trimethylcyclotrisiloxane, hexadecamethylcyclooctasiloxane, pentamethylcyclopentasiloxane, hexamethylcyclohexasiloxane, octaphenylcyclotetrasiloxane, triphenylcyclotrisiloxane, tetraphenylcyclotetrasiloxane, tetramethyl-tetraphenylcyclotetrasiloxane, tetravinyl-tetraphenylcyclotetrasiloxane, hexamethyl-hexavinylcyclohexasiloxane, hexamethyl-hexaphenylcyclohexasiloxane, or hexavinyl-hexaphenylcyclohexasiloxane.

The silsesquioxane compound has a cage structure and may include a silsesquioxane composed of $RSiO_{3/2}$ (where R is a hydrogen atom, a $C_1$ to $C_5$ alkyl group, a $C_2$ to $C_5$ alkenyl group, a $C_1$ to $C_5$ alkoxy group, or a $C_6$ to $C_{10}$ aryl group). In an implementation, the silsesquioxane compound may include, e.g., octaphenyl silsesquioxane, octamethyl silsesquioxane, or octavinyl silsesquioxane.

In an implementation, the cyclosiloxane compound and/or the silsesquioxane compound may be present in an amount of, e.g., about 0.1 wt % to about 2 wt %, based on the total weight of the composition for solar cell electrodes. Within this range, the cyclosiloxane compound and/or the silsesquioxane compound may help reduce the area change rate of the composition and prevent increase in resistance values of a solar cell.

Organic Vehicle

The organic vehicle may impart suitable viscosity and rheological characteristics for printing to the composition for solar cell electrodes through mechanical mixing with the inorganic component of the composition.

The organic vehicle may be a suitable organic vehicle for a composition for solar cell electrodes and may include, e.g., a binder resin, a solvent, and the like.

The binder resin may include acrylate resins or cellulose resins. Ethyl cellulose may be used as the binder resin. In an implementation, the binder resin may be of ethyl hydroxyethyl cellulose, nitrocellulose, blends of ethyl cellulose and phenol resins, alkyd resins, phenol resins, acrylic acid ester resins, xylene resins, polybutane resins, polyester resins, urea resins, melamine resins, vinyl acetate resins, wood rosin, polymethacrylates of alcohols, and the like.

The solvent may include, e.g., hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzylalcohol, γ-butyrolactone, ethyl lactate, or 2,2,4-trimethyl-1,3-pentanediol monoisobutyrate (e.g., Texanol). These may be used alone or as a mixture thereof.

In an implementation, the organic vehicle may be present in an amount of, e.g., about 1 wt % to about 30 wt %, based on the total weight of the composition for solar cell electrodes. Within this range, the organic vehicle can provide sufficient adhesive strength and excellent printability to the composition.

Additives

The composition for solar cell electrodes may further include suitable additives to help enhance fluidity, process properties, and/or stability, as desired. In an implementation, the additives may include, e.g., dispersants, thixotropic agents, plasticizers, viscosity stabilizers, anti-foaming agents, pigments, UV stabilizers, antioxidants, coupling agents, or the like. These additives may be used alone or as mixtures thereof. In an implementation, the additives may be present in an amount of, e.g., about 0.1 wt % to about 5 wt %, based on the total weight of the conductive paste, although the content of the additives may be changed, as needed.

Solar cell electrode and solar cell including the same

The embodiments may provide an electrode formed of the composition for solar cell electrodes and a solar cell including the same. The FIGURE illustrates a solar cell 100 in accordance with one embodiment.

Referring to the FIGURE, a rear electrode 21 and a front electrode 23 may be formed by printing the composition for electrodes on a wafer 10 or substrate including a p-layer (or an n-layer) 11 and an n-layer (or a p-layer) 12 as an emitter, followed by baking. For example, a preliminary process of preparing the rear electrode may be performed by printing the composition on a back surface of the wafer and drying the printed composition at about 200° C. to about 400° C. for about 10 to 60 seconds. Further, a preliminary process for preparing the front electrode may be performed by printing the composition on a front surface of the wafer and drying the printed composition. Then, the front electrode 23 and the rear electrode 21 may be formed by baking the wafer at about 400° C. to about 950° C., preferably at about 700° C. to about 950° C., for about 30 to 210 seconds.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

As an organic binder, 0.5 wt % of ethyl cellulose (STD4, Dow Chemical Company) was sufficiently dissolved in 6.4 wt % of Texanol (Eastman Chemical Company) at 60° C., and 89.0 wt % of spherical silver powder (AG-5-11F, Dowa Hightech Co., Ltd.) having an average particle diameter of 2.0 μm, 2.5 wt % of a Bi—Te—Zn—Li—O-based glass frit prepared using components listed in Table 1 (average particle diameter: 1.0 μm. glass transition temperature: 273° C.), 0.8 wt % of hexamethylcyclotrisiloxane (H0725, Tokyo Chemical Industry) as a cyclosiloxane compound, 0.4 wt % of a dispersant BYK102 (BYK-chemie), and 0.4 wt % of a thixotropic agent Thixatrol ST (Elementis Co., Ltd.) were added to the binder solution, followed by mixing and kneading in a 3-roll kneader, thereby preparing a composition for solar cell electrodes.

TABLE 1

|  | $Bi_2O_3$ | $TeO_2$ | $ZnO$ | $Li_2O$ |
|---|---|---|---|---|
| Amount (wt %) | 15.8 | 53.8 | 13.2 | 17.2 |

Example 2

A composition for solar cell electrodes was prepared in the same manner as in Example 1 except that octamethylcyclotetrasiloxane (00142, Tokyo Chemical Industry) was used as the cyclosiloxane compound (instead of hexamethylcyclotrisiloxane).

Example 3

A composition for solar cell electrodes was prepared in the same manner as in Example 1 except that decamethylcyclopentasiloxane (D1890, Tokyo Chemical Industry) was used as the cyclosiloxane compound (instead of hexamethylcyclotrisiloxane).

Example 4

A composition for solar cell electrodes was prepared in the same manner as in Example 1 except that dodecamethylcyclohexasiloxane (D2040, Tokyo Chemical Industry) was used as the cyclosiloxane compound (instead of hexamethylcyclotrisiloxane).

Example 5

A composition for solar cell electrodes was prepared in the same manner as in Example 1 except that tetradecamethylcycloheptasiloxane (T2678, Tokyo Chemical Industry) was used as the cyclosiloxane compound (instead of hexamethylcyclotrisiloxane).

Example 6

A composition for solar cell electrodes was prepared in the same manner as in Example 1 except that octadecamethylcyclononasiloxane (00425, Tokyo Chemical Industry) was used as the cyclosiloxane compound (instead of hexamethylcyclotrisiloxane).

Example 7

A composition for solar cell electrodes was prepared in the same manner as in Example 1 except that 2,4,6,8-tetramethylcyclotetrasiloxane (T2076, Tokyo Chemical Industry) was used as the cyclosiloxane compound (instead of hexamethylcyclotrisiloxane).

Example 8

A composition for solar cell electrodes was prepared in the same manner as in Example 1 except that hexaphenylcyclotrisiloxane (H1248, Tokyo Chemical Industry) was used as the cyclosiloxane compound (instead of hexamethylcyclotrisiloxane).

Example 9

A composition for solar cell electrodes was prepared in the same manner as in Example 1 except that 2,4,6,8-tetramethyl-2,4,6,8-tetravinylcyclotetrasiloxane (T2523, Tokyo Chemical Industry) was used as the cyclosiloxane compound (instead of hexamethylcyclotrisiloxane).

Example 10

A composition for solar cell electrodes was prepared in the same manner as in Example 1 except that 1,3,5-tris(3,3,3-trifluoropropyl)-1,3,5-trimethylcyclotrisiloxane (T3226, Tokyo Chemical Industry) was used as the cyclosiloxane compound (instead of hexamethylcyclotrisiloxane).

Example 11

A composition for solar cell electrodes was prepared in the same manner as in Example 1 except that octaphenylsilsesquioxane (00349, Tokyo Chemical Industry) was used as a silsesquioxane compound, instead of the cyclosiloxane compound (hexamethylcyclotrisiloxane).

Example 12

A composition for solar cell electrodes was prepared in the same manner as in Example 1 except that 0.2 wt % of decamethylcyclopentasiloxane (D1890, Tokyo Chemical Industry) was used as the cyclosiloxane compound (instead of hexamethylcyclotrisiloxane) and 7.0 wt % of Texanol (Eastman Chemical Company) was used.

Example 13

A composition for solar cell electrodes was prepared in the same manner as in Example 1 except that 1.4 wt % of decamethylcyclopentasiloxane (D1890, Tokyo Chemical Industry) was used as the cyclosiloxane compound (instead of hexamethylcyclotrisiloxane) and 5.8 wt % of Texanol (Eastman Chemical Company) was used.

Example 14

A composition for solar cell electrodes was prepared in the same manner as in Example 1 except that 2.0 wt % of decamethylcyclopentasiloxane (D1890, Tokyo Chemical Industry) was used as the cyclosiloxane compound (instead of hexamethylcyclotrisiloxane) and 5.2 wt % of Texanol (Eastman Chemical Company) was used.

Example 15

A composition for solar cell electrodes was prepared in the same manner as in Example 1 except that 0.1 wt % of decamethylcyclopentasiloxane (D1890, Tokyo Chemical Industry) was used as the cyclosiloxane compound (instead of hexamethylcyclotrisiloxane) and 7.1 wt % of Texanol (Eastman Chemical Company) was used.

Comparative Example 1

A composition for solar cell electrodes was prepared in the same manner as in Example 1 except that a cyclosiloxane compound was not included and 7.2 wt % of Texanol (Eastman Chemical Company) was used.

Comparative Example 2

A composition for solar cell electrodes was prepared in the same manner as in Example 1 except that 0.8 wt % of polydimethylsiloxane (TEGO Glide 410, Evonik Industries) was included (as a linear siloxane) instead of the cyclosiloxane compound.

Comparative Example 3

A composition for solar cell electrodes was prepared in the same manner as in Example 1 except that 0.8 wt % of polydimethylsiloxane (TEGO Flow ATF2, Evonik Industries) was included (as a linear siloxane) instead of the cyclosiloxane compound.

Comparative Example 4

A composition for solar cell electrodes was prepared in the same manner as in Example 1 except that 0.8 wt % of octamethyltrisiloxane was included (as a linear siloxane) instead of the cyclosiloxane compound.

Comparative Example 5

A composition for solar cell electrodes was prepared in the same manner as in Example 1 except that 0.8 wt % of 1,3-dicyclohexyl-1,1,3,3-tetrakis(dimethylsilyloxy)disiloxane (52004, Sigma-Aldrich Corporation) was included (as branched siloxane) instead of the cyclosiloxane compound.

Amount of each component used in the Examples and Comparative Example is shown in Table 2 (unit: wt %).

TABLE 2

| Item | Organic vehicle | Solvent | Cyclosiloxane | Silsesquioxane | Linear siloxane | Silver powder | Glass frit | Dispersant | Thixotropic agent |
|---|---|---|---|---|---|---|---|---|---|
| Example 1 | 0.5 | 6.4 | 0.8 | — | — | 89 | 2.5 | 0.4 | 0.4 |
| Example 2 | 0.5 | 6.4 | 0.8 | — | — | 89 | 2.5 | 0.4 | 0.4 |
| Example 3 | 0.5 | 6.4 | 0.8 | — | — | 89 | 2.5 | 0.4 | 0.4 |
| Example 4 | 0.5 | 6.4 | 0.8 | — | — | 89 | 2.5 | 0.4 | 0.4 |
| Example 5 | 0.5 | 6.4 | 0.8 | — | — | 89 | 2.5 | 0.4 | 0.4 |
| Example 6 | 0.5 | 6.4 | 0.8 | — | — | 89 | 2.5 | 0.4 | 0.4 |
| Example 7 | 0.5 | 6.4 | 0.8 | — | — | 89 | 2.5 | 0.4 | 0.4 |
| Example 8 | 0.5 | 6.4 | 0.8 | — | — | 89 | 2.5 | 0.4 | 0.4 |
| Example 9 | 0.5 | 6.4 | 0.8 | — | — | 89 | 2.5 | 0.4 | 0.4 |
| Example 10 | 0.5 | 6.4 | 0.8 | — | — | 89 | 2.5 | 0.4 | 0.4 |
| Example 11 | 0.5 | 6.4 | — | 0.8 | — | 89 | 2.5 | 0.4 | 0.4 |
| Example 12 | 0.5 | 7.0 | 0.2 | — | — | 89 | 2.5 | 0.4 | 0.4 |
| Example 13 | 0.5 | 5.8 | 1.4 | — | — | 89 | 2.5 | 0.4 | 0.4 |
| Example 14 | 0.5 | 5.2 | 2.0 | — | — | 89 | 2.5 | 0.4 | 0.4 |
| Example 15 | 0.5 | 7.1 | 0.1 | — | — | 89 | 2.5 | 0.4 | 0.4 |
| Comparative Example 1 | 0.5 | 7.2 | — | — | — | 89 | 2.5 | 0.4 | 0.4 |
| Comparative Example 2 | 0.5 | 6.4 | — | — | 0.8 | 89 | 2.5 | 0.4 | 0.4 |
| Comparative Example 3 | 0.5 | 6.4 | — | — | 0.8 | 89 | 2.5 | 0.4 | 0.4 |
| Comparative Example 4 | 0.5 | 6.4 | — | — | 0.8 | 89 | 2.5 | 0.4 | 0.4 |
| Comparative Example 5 | 0.5 | 6.4 | — | — | 0.8 | 89 | 2.5 | 0.4 | 0.4 |

Each of solar cells manufactured using the compositions of the Examples and Comparative Examples was evaluated as to the following properties. Results are shown in Table 3.

(1) Area Change Rate

Each of the compositions for solar cell electrodes prepared in the Examples and Comparative Examples was deposited over a front surface of a monocrystalline silicon wafer by screen printing in a predetermined pattern (screen mask: 360 mesh, emulsion: 15, width: 35 μm) to form an electrode, followed by measuring a cross sectional area $S_0$ (unit: μm$^2$) of the electrode before baking. The electrode had a trapezoidal shape, a maximum width of 60 μm, and a maximum height of 17 μm. The electrode was dried at 300° C. for 40 seconds and then baked at 800° C. for 60 seconds, followed by measuring a cross sectional area $S_1$ (unit: $\mu m^2$) of the electrode. Here, the cross-sectional area of the electrode was measured using a 3D laser microscope VK-9700 (KEYENCE Corp.). The area change rate was calculated according to Equation 1 using the obtained $S_0$ and $S_1$ values.

(2) Electrical Properties

Each of the compositions for solar cell electrodes prepared in the Examples and Comparative Examples was deposited over a front surface of a wafer (a polycrystalline wafer prepared by texturing a front surface of a p-type wafer doped with boron (B), forming an n+ layer of $POCL_3$, and forming an anti-reflection film of silicon nitride ($SiN_x$:H) on the n+ layer) by screen printing in a predetermined pattern, followed by drying in an IR drying furnace at 300° C. to 400° C. Then, an aluminum paste was printed on a back surface of the wafer and dried in the same manner as above. A cell formed according to this procedure was subjected to baking at a temperature of 400° C. to 900° C. for 60 seconds in a belt-type baking furnace, thereby fabricating a solar cell. The fabricated solar cell was evaluated as to contact resistance (Rc), serial resistance (Rs), and open circuit voltage (Voc) using a solar cell efficiency tester (CT-801, Pasan Co., Ltd.).

TABLE 3

| Item | Area change rate (%) | Contact resistance (Ω) | Serial resistance (Ω) | Open circuit voltage (mV) |
|---|---|---|---|---|
| Example 1 | 35.79 | 0.98 | 1.76 | 632.28 |
| Example 2 | 43.58 | 1.00 | 1.18 | 630.66 |
| Example 3 | 44.19 | 0.61 | 1.88 | 632.67 |
| Example 4 | 44.97 | 0.21 | 1.14 | 627.95 |
| Example 5 | 35.22 | 0.19 | 1.60 | 629.58 |
| Example 6 | 40.83 | 0.79 | 1.51 | 632.02 |
| Example 7 | 40.91 | 0.97 | 1.49 | 629.85 |
| Example 8 | 40.16 | 0.90 | 1.52 | 632.32 |
| Example 9 | 39.87 | 0.75 | 1.82 | 627.90 |
| Example 10 | 37.77 | 0.92 | 1.31 | 633.39 |
| Example 11 | 37.89 | 0.68 | 1.73 | 634.57 |
| Example 12 | 38.08 | 0.99 | 1.85 | 627.50 |
| Example 13 | 38.38 | 0.55 | 1.78 | 632.67 |
| Example 14 | 38.32 | 0.84 | 1.62 | 634.30 |
| Example 15 | 41.36 | 1.00 | 1.48 | 631.51 |
| Comparative Example 1 | 68.57 | 1.70 | 2.50 | 620.17 |
| Comparative Example 2 | 66.72 | 1.35 | 2.64 | 619.82 |
| Comparative Example 3 | 70.56 | 1.57 | 2.76 | 623.34 |
| Comparative Example 4 | 68.88 | 1.23 | 2.98 | 623.32 |
| Comparative Example 5 | 74.04 | 1.50 | 2.98 | 620.28 |

As shown in Table 3, it may be seen that the compositions of solar cell electrodes according to Examples 1-15 (including the cyclosiloxane compound or the silsesquioxane compound) had a low rate of change in area of an electrode after baking, as calculated according to Equation 1, and thus exhibited excellent processability and reliability when used to fabricate an electrode while providing excellent electrical properties such as contact resistance, serial resistance, and open circuit voltage after baking.

Conversely, it may be seen that the composition of Comparative Example 1 (not including a cyclosiloxane or silsesquioxane) caused considerable increase in line width when printed in a wafer and had a high area change rate, and the composition of Comparative Examples 2 to 5 (including a linear or branched siloxane compound instead of the cyclosiloxane compound or silsesquioxane compound) caused considerable increase in electrode shrinkage during baking and thus had a high area change rate.

By way of summation and review, Ag pastes may be used to form the front electrode. For a baking-type solar cell electrode paste, optimum baking conditions may be changed depending upon variables in a wafer manufacturing process (e.g., range of emitter sheet resistance, thickness of an antireflection film formed by PECVD, and surface unevenness during a texturing process). For example, as the thickness of an emitter layer is continuously reduced to increase solar cell efficiency, shunting may occur due to solar cell electrode pastes. In order to prepare an electrode paste operable under a wide range of sheet resistances from low sheet resistance to high sheet resistance, glass frits and electrode pastes may not affect a p-n junction of the wafer while having sufficiently low contact resistance.

Sunlight incident on a solar cell may not be completely converted into electrical energy, and it may be helpful to reduce loss factors for a high-efficiency solar cell. Loss factors in a solar cell may be broadly divided into optical loss and electrical loss. Examples of optical loss may include reflection at a surface of a solar cell when sunlight is incident on the solar cell, shadow loss due to electrodes, and wavelength-dependent loss.

In some solar cells, electrodes may be formed on a front surface of the solar cell on which sunlight is incident. When sunlight is blocked by shadows of the electrodes, a dead area may be created, which contributes to reduction in absorption of sunlight. This is referred to as 'shadowing', which is an obstacle to high solar cell conversion efficiency. Although it is possible to reduce shadowing by reducing an electrode linewidth, simple reduction in electrode linewidth may cause reduction in cross-sectional area of the electrode and thus increase serial resistance.

The embodiments may provide a composition for solar cell electrodes that has a low area change rate of an electrode after baking and thus can exhibit excellent processability and reliability when used to fabricate the electrode.

The embodiments may provide a composition for solar cell electrodes that has excellent electrical properties such as contact resistance, serial resistance, and open circuit voltage after baking while providing high efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A composition for a front electrode of a solar cell, the composition comprising:
    about 60 wt % to about 95 wt % of silver powder;
    about 0.1 wt % to about 20 wt % of a glass frit;
    about 0.1 wt % to 2 wt % of at least one of a cyclosiloxane compound and a silsesquioxane compound; and
    about 1 wt % to about 30 wt % of an organic vehicle, all wt % being based on a total weight of the composition,
    wherein the composition has an area change rate of 60% or less, as calculated according to the following Equation 1:

$$\text{Area change rate} = (|S_1 - S_0|/S_0) \times 100 \qquad (1),$$

wherein, in Equation 1,

S₀ denotes a cross-sectional area in μm² of a front electrode formed by printing the composition and not subjected to drying and baking, and S₁ denotes a cross-sectional area in μm² of the front electrode subjected to drying at 300° C. for 40 seconds and baking at 800° C. for 60 seconds.

2. The composition for a front electrode of a solar cell as claimed in claim 1, wherein the at least one of the cyclosiloxane compound and silsesquioxane compound is present in an amount of about 0.1 wt % to about 2 wt % in the composition for solar cell electrodes.

3. The composition for a front electrode of a solar cell as claimed in claim 1, wherein:
the composition includes the cyclosiloxane compound, and
the cyclosiloxane compound includes hexamethylcyclotrisiloxane, octamethylcyclotetrasiloxane, decamethylcyclopentasiloxane, dodecamethylcyclohexasiloxane, tetradecamethylcycloheptasiloxane, octadecamethylcyclononasiloxane, tetramethylcyclotetrasiloxane, hexaphenylcyclotrisiloxane, tetramethyl-tetravinylcyclotetrasiloxane, tris(trifluoropropyl)-trimethylcyclotrisiloxane, hexadecamethylcyclooctasiloxane, pentamethylcyclopentasiloxane, hexamethylcyclohexasiloxane, octaphenylcyclotetrasiloxane, triphenylcyclotrisiloxane, tetraphenylcyclotetrasiloxane, tetramethyl-tetraphenylcyclotetrasiloxane, tetravinyl-tetraphenylcyclotetrasiloxane, hexamethyl-hexavinylcyclohexasiloxane, hexamethyl-hexaphenylcyclohexasiloxane, or hexavinyl-hexaphenylcyclohexasiloxane.

4. The composition for a front electrode of a solar cell as claimed in claim 1, wherein:
the composition includes the silsesquioxane compound, and
the silsesquioxane compound includes octaphenylsilsesquioxane, octamethylsilsesquioxane, or octavinylsilsesquioxane.

5. The composition for a front electrode of a solar cell as claimed in claim 1, wherein the glass frit includes a bismuth-tellurium-oxide (Bi—Te—O)-based glass frit.

6. The composition for a front electrode of a solar cell as claimed in claim 5, wherein the bismuth-tellurium-oxide (Bi—Te—O)-based glass frit further includes lithium (Li), zinc (Zn), phosphorus (P), germanium (Ge), gallium (Ga), cerium (Ce), iron (Fe), silicon (Si), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), or manganese (Mn).

7. The composition for a front electrode of a solar cell as claimed in claim 1, further comprising a dispersant, a thixotropic agent, a plasticizer, a viscosity stabilizer, an anti-foaming agent, a pigment, a UV stabilizer, an antioxidant, or a coupling agent.

* * * * *